United States Patent
Sharifipour et al.

(10) Patent No.: US 8,295,048 B2
(45) Date of Patent: Oct. 23, 2012

(54) APPARATUS FOR AND METHOD OF COOLING ELECTRONIC CIRCUITS

(75) Inventors: Bahman Sharifipour, Westford, MA (US); Arian Jansen, Thousand Oaks, CA (US)

(73) Assignee: Flextronics AP, LLC, Broomfield, CO (US)

( * ) Notice: Subject to any disclaimer, the term of this patent is extended or adjusted under 35 U.S.C. 154(b) by 9 days.

(21) Appl. No.: 12/973,774

(22) Filed: Dec. 20, 2010

(65) Prior Publication Data

US 2011/0103119 A1 May 5, 2011

Related U.S. Application Data

(62) Division of application No. 11/220,811, filed on Sep. 6, 2005, now Pat. No. 7,885,076.

(60) Provisional application No. 60/609,507, filed on Sep. 7, 2004.

(51) Int. Cl.
*H05K 7/20* (2006.01)

(52) U.S. Cl. ......... 361/710; 361/707; 363/141; 174/548

(58) Field of Classification Search .................. 361/688, 361/701–705, 707–715, 717–722, 728, 730, 361/746, 748, 750–752, 807, 809, 820
See application file for complete search history.

(56) References Cited

U.S. PATENT DOCUMENTS

| | | |
|---|---|---|
| 4,069,497 A | 1/1978 | Steidlitz |
| 4,273,406 A | 6/1981 | Okagami |
| 4,645,278 A | 2/1987 | Yevak et al. |
| 4,712,160 A | 12/1987 | Sato et al. |
| 4,788,626 A | 11/1988 | Neidig et al. |
| 4,806,110 A | 2/1989 | Lindeman |
| 4,841,220 A | 6/1989 | Tabisz et al. |
| 4,857,822 A | 8/1989 | Tabisz et al. |
| 4,866,367 A | 9/1989 | Ridley et al. |
| 4,890,217 A | 12/1989 | Conway |
| 4,893,227 A | 1/1990 | Gallios et al. |
| 4,899,256 A | 2/1990 | Sway-Tin |
| 4,901,069 A | 2/1990 | Veneruso |
| 5,075,821 A | 12/1991 | McDonnal |
| 5,090,919 A | 2/1992 | Tsuji |

(Continued)

FOREIGN PATENT DOCUMENTS

GB  225 2208 A  7/1992

OTHER PUBLICATIONS

Second Office Action, application No. 2005800297977, application date: Sep. 7, 2005, entitled "An Apparatus for and Method of Cooling Molded Electronic Circuits", date of issue: Mar. 3, 2011, 6 pages.

(Continued)

*Primary Examiner* — Courtney Smith
(74) *Attorney, Agent, or Firm* — Haverstock & Owens LLP

(57) ABSTRACT

An electronic device such as an AC/DC power adapter includes a conductive heat dissipation system. The device contains heat generating components and is powered via power supply leads by an external power supply circuit. The device further contains a thermally conductive mass that is thermally coupled to both the heat generating components and to the power supply leads. When the power supply leads are coupled to receive electricity from the external power supply circuit, heat generated by the device is thermally conducted into the external power supply circuit via the power supply leads.

26 Claims, 2 Drawing Sheets

U.S. PATENT DOCUMENTS

| | | | |
|---|---|---|---|
| 5,101,322 | A | 3/1992 | Ghaem et al. |
| 5,132,890 | A | 7/1992 | Blandino |
| 5,170,067 | A * | 12/1992 | Baum et al. .................. 307/10.1 |
| 5,235,491 | A | 8/1993 | Weiss |
| 5,272,599 | A | 12/1993 | Koenen |
| 5,295,044 | A | 3/1994 | Araki et al. |
| 5,365,403 | A | 11/1994 | Vinciarelli et al. |
| 5,673,185 | A | 9/1997 | Albach et al. |
| 5,811,895 | A | 9/1998 | Suzuki et al. |
| 5,838,554 | A | 11/1998 | Lanni |
| 5,859,771 | A | 1/1999 | Kniegl |
| 5,920,458 | A | 7/1999 | Azar |
| 5,923,543 | A | 7/1999 | Choi |
| 5,933,324 | A | 8/1999 | Barrett |
| 6,091,611 | A | 7/2000 | Lanni |
| 6,183,302 | B1 | 2/2001 | Daikuhara et al. |
| 6,243,269 | B1 | 6/2001 | Dibene, II et al. |
| 6,272,015 | B1 | 8/2001 | Mangtani |
| 6,282,092 | B1 | 8/2001 | Okamoto et al. |
| 6,323,627 | B1 | 11/2001 | Schmiederer et al. |
| 6,369,328 | B1 | 4/2002 | Munakata |
| 6,388,897 | B1 | 5/2002 | Ying et al. |
| 6,390,854 | B2 | 5/2002 | Yamamoto et al. |
| 6,459,175 | B1 | 10/2002 | Potega |
| 6,549,409 | B1 | 4/2003 | Saxelby et al. |
| 6,578,253 | B1 | 6/2003 | Herbert |
| 6,775,162 | B2 | 8/2004 | Mihai et al. |
| 6,795,315 | B1 | 9/2004 | Wu et al. |
| 7,035,126 | B1 | 4/2006 | Lanni |
| 7,038,406 | B2 | 5/2006 | Wilson |
| 7,160,124 | B2 | 1/2007 | Bhutani |
| 7,208,833 | B2 | 4/2007 | Nobori et al. |
| 7,212,420 | B2 | 5/2007 | Liao |
| 7,274,175 | B2 | 9/2007 | Manolescu |
| 7,450,388 | B2 | 11/2008 | Beihoff et al. |
| 7,499,301 | B2 | 3/2009 | Zhou |
| 7,978,489 | B1 * | 7/2011 | Telefus et al. .................. 363/146 |
| 2001/0045297 | A1 | 11/2001 | Miller et al. |
| 2002/0008963 | A1 | 1/2002 | DiBene, II et al. |
| 2002/0011823 | A1 | 1/2002 | Lee |
| 2002/0092160 | A1 | 7/2002 | McCullough |
| 2003/0035303 | A1 | 2/2003 | Balakrishnan et al. |
| 2004/0008532 | A1 | 1/2004 | Asawa |
| 2004/0122606 | A1 | 6/2004 | Cohen et al. |
| 2004/0144527 | A1 | 7/2004 | Yang et al. |
| 2005/0024016 | A1 | 2/2005 | Breen et al. |
| 2005/0138437 | A1 | 6/2005 | Allen et al. |
| 2005/0225257 | A1 | 10/2005 | Green |
| 2006/0022637 | A1 | 2/2006 | Wang et al. |
| 2006/0152947 | A1 | 7/2006 | Baker et al. |
| 2006/0196642 | A1 | 9/2006 | Gharib |

OTHER PUBLICATIONS

EE Times.com—Team Claims Midrange Wireless Energy Transfer, by R. Colin Johnson, 4 pages, Nov. 6, 2007.

EE Times.com—"Wireless Beacon Could Recharge Consumer Devices", by R. Colin Johnson, 3 pages, Nov. 6, 2007.

Hang-Seok Choi et al., Novel Zero-Voltage and Zero-Current-Switching (ZVZCS), Full-Bridge PWM Converter Using Coupled Output Inductor, Sep. 2002 IEEE, pp. 641-648.

"New Architectures for Radio-Frequency dc/dc Power Conversion", Juan Rivas et al., Laboratory for Electromagnetic and Electronic Systems, Jan. 2004, Massachusetts Institute of Technology, Room 10-171 Cambridge, MA 02139, pp. 4074-4084.

"Randomized Modulation in Power Electronic Converters", Aleksander M. Stankovic, member IEEE, and Hanoch Lev-Ari, vol. 90, No. 5, May 2002, pp. 782-799.

"Analysis and Special Characteristics of a Spread-Spectrum Technique for Conducted EMI Suppression", K.K. Tse, et al. Member IEEE, IEEE transactions on Power Electronics, vol. 15., No. 2, Mar. 2000, pp. 399-410.

3rd Office Action dated Mar. 23, 2012, Patent Application No. 200580029797.7, Application date: Sep. 7, 2005, Agent: China Patent Agent (H.K.),18 pages.

* cited by examiner

APPARATUS FOR AND METHOD OF COOLING ELECTRONIC CIRCUITS

RELATED APPLICATIONS

This Patent Application is a divisional application under 35 U.S.C. §§120 and 121 of U.S. patent application Ser. No. 11/220,811, filed Sep. 6, 2005, entitled "An Apparatus For And Method Of Cooling Molded Electronic Circuits," which in turn claims priority under 35 U.S.C. §119(e) of the U.S. Provisional Pat. App. No. 60/609,507, filed Sep. 7, 2004, entitled "Integrated Connector and AC/DC Converter," both of which are hereby incorporated by reference.

FIELD OF THE INVENTION

The instant invention relates to a heat dissipating system for electronic devices. More specifically, a heat dissipating system that allows for more compact device packages while maintaining current standards for heat-dissipation, temperature equalization and overheating prevention. In particular, the instant invention reveals a compact AC/DC power converter cooled according to the present invention.

BACKGROUND

Many electronics circuits depend on reliable heat dissipation systems to ensure stable operation and efficiency. Thermal excitement in electrical systems leads to increased noise. Without an effective heat dissipation system, failure or unstable operation is possible.

Conventional heat dissipation systems depend on one or more of the following strategies: passive convection operating directly on the heat producing components of the electronic device; addition of an active cooling solution, such as a fan or liquid cooling system; placement of a heat sink in conductive contact with the heat producing components, such that the heat sink and the components are then in thermal equilibrium and both dissipate heat through convective means.

To offer higher capacity heat transfer, new heat dissipation equipment must be more efficient. It is difficult for air-cooled heat sinks to grow in size, because equipment manufacturers are under tremendous competitive pressure to maintain or diminish the size of their equipment packages, all the while filling them with more and more components. In addition, larger heat sinks typically will increase the cost of the heat sink element. Thus, competitive heat dissipation equipment must be relatively compact in size and must perform at levels sufficient to prevent high-performance components from exceeding their operational heat specifications.

Conventional heat dissipation systems are at odds with these requirements. Heat sinks and active cooling solutions are bulky and require additional space within the device package. Even passive convective cooling requires the allotment of space within the device to allow for air flow.

Prior work in the art has shown that a solution analogous to a heat sink need not require additional space within the device package. United States Patent Publication No. 2002-0092160 reveals a device wherein the structural frame is composed of a heat conductive material and is thermally coupled to the electronic components therein, whereby the frame and electronic components are at thermal equilibrium and passive convective cooling of the entire system occurs more rapidly than it otherwise would.

This type of cooling system, relying on heat dissipation through passive convection, is acceptable for low power, battery-operated, portable applications. Higher power electronics create more heat, and dissipation thereof through the exterior of the device package could presumably allow the exterior surface to reach an unsafe temperature. For the same reasons, attaching any form of heat sink to the exterior of a device would not only increase the package bulk, but allow for possible user contact with a hot element used.

Traditional AC/DC power converters, such as for cellular telephones typically include a plastic housing with air or other insulation surrounding the electronic power convertor circuit. For cooling, such circuits have relied on large device packages and, in some cases, the presence of vents to facilitate passive convective cooling of an enclosed circuit board including a plurality of electronic components mounted on a PCB. This strategy results in a device inconveniently large in size. Furthermore, the convective means of cooling circuitry in an enclosed space, even with vent holes, has poor efficiency, resulting in a high equilibrium operating temperature for the electronic device.

This construction method results in large device packages for several reasons. Conventional power conversion circuits include primary and secondary circuits: a primary circuit is connected directly with the AC power input to be converted and power is output through the secondary circuit. Safety regulations require a minimum distance of 6.4 min between the secondary and primary circuits through air. Further, because government regulations mandate that operating temperatures in such devices not exceed a certain range above the ambient temperature, smaller device packages are not feasible using prior art techniques: a package having a large surface area is often the only means of achieving the needed heat dissipation. Devices constructed according to prior art techniques to have a certain size. This is true since even low powered devices, which might obtain sufficient heat dissipation through a small package, because they are required to meet the through-air requirement of a 6.4 mm spacing.

In view of this, users must carry an undesirably large power converter to charge their cellular telephone. It is further well known in the art that relatively higher operating temperatures result in relatively higher incidence of device failure and in less efficient operation.

Because current cooling system designs necessitate large device packages, especially in power conversion devices, many current power converter designs are bulky and inconvenient. Compare the power adapters designed to charge cellular phone batteries with a standard AC power plug. The typical cellular telephone power adapter employs a bulky housing to hold the plug blades and the power conversion circuitry. The relatively large size of the power adapter is necessary because of the heat dissipation requirements outlined above. Exclusive of those requirements, it is apparent that a smaller, more compact device packaging would be advantageous for such power adapters. The advantages of such a construction are especially clear since cellular phone adapters are necessarily portable and thus stand to benefit substantially from a sleeker device packaging.

In view of the above, there is a demonstrated need for a cooling system capable of handling the large heat loads created in power electronics, but that also allows for compact device packaging and does not present a hazard to the user. This need is especially apparent in the field of power converter manufacturing, where current cooling systems preclude the creation of a compact power converter that is both efficient and reliable.

SUMMARY OF THE DISCLOSURE

The present invention represents an improvement of prior art cooling systems for externally powered electronic devices.

It provides all the advantages of an extended external heat sink assembly, allowing for compact device packaging while maintaining a reasonably cool operating temperature. However, the present invention requires no external apparatus aside from the familiar power supply, which in most cases takes the form of a wall outlet.

In accordance with the embodiments of the present invention, a compact power conversion device is provided. The device comprises a power conversion circuit coupled to receive electric power from a power supply network via power supply leads, and a heat conductive body thermally coupled with the power conversion circuit for substantially efficient heat transfer from the power conversion circuit and to the power supply leads. Wherein the thermal coupling is such that heat generated by the power conversion circuit is transferred to the power supply network. By conduction through the heat conductive body, then the power supply leads and into the wires of the power supply network.

According to the present invention, one way to achieve the thermal coupling is to mold the heat conductive body around at least a portion of the power conversion circuit and around at least a portion of the power supply leads. In this construction, the power supply leads are coupled by thermal conduction to the power conversion circuit to allow substantially efficient heat transfer from the circuit to the leads. The leads are thermally conductive and transfer heat into the power supply wall socket and subsequently to the wiring in the wall. In further aspects of the present invention, the device has power output leads coupled with the power conversion circuit to transmit the converted power to a distant load.

In addition to maintaining good heat dissipation characteristics, the present invention discloses several device designs having good structural integrity. In one aspect, the compact power conversion device further comprises a substantially rigid body coupled with the heat conductive body and with the power conversion circuit to provide structural support. In another aspect, the heat conductive body forms also a structural enclosure for the power conversion circuit and the power supply leads. In this case the heat conductive body should conform to accepted strength of materials standards for use as a structural element in an electrical housing.

In the compact power conversion device of the present invention, the heat conductive body should have at least a minimum thermal conductivity to allow adequate heat dissipation and a low electrical conductivity to prevent short circuits. Further, when the conductive body is used in a structural capacity, or as insulation between the primary and secondary portions of the conversion circuit, it is formed from a UL recognized insulation material.

Also in the present invention, a power converter is provided. The power converter comprises a circuit for converting an electric signal, power supply leads coupled to provide the electric signal to the circuit, and an electrically inert, thermally conductive mass coupled with the circuit to transfer heat generated by the circuit to the power supply leads. In the power converter according to the present invention, the power supply leads are also thermally coupled to a power supply network such that the heat generated by the circuit is transferred to the power supply network.

In a further aspect of the present invention a method of cooling an electronic device supplied by an external power source is provided. The method comprises thermally coupling for substantially efficient heat transfer at least a portion of an electronic device to a thermally conductive body, and thermally coupling for substantially efficient heat transfer at least a portion of each of a plurality of power supply leads to the thermally conductive body.

The method of the present invention further comprises enclosing the electronic device, at least a portion of each of the plurality of power supply leads and the thermally conductive body in any appropriate, rigid shell body, whereby the electronic device is simultaneously embedded in the rigid shell material and in the thermally conductive body.

In accordance with the method of the present invention, the thermally conductive body should have at least a minimum thermal conductivity to allow adequate heat dissipation and a low electrical conductivity to prevent short circuits. Further, when the thermally conductive body is used in a structural capacity, or as electrical insulation between the primary and secondary portions of the conversion circuit, it is formed from UL recognized electrical insulation material.

An AC/DC converter assembly is provided in the present invention. The AC/DC converter assembly of the present invention comprises an AC/DC converter circuit having a primary portion and a secondary portion, a plurality of AC plugs coupled with the AC/DC converter circuit, and a housing comprising a thermally conductive and electrically resistive body molded around the AC/DC converter circuit and also around at least a portion of each of the plurality of AC plugs so that the thermally conductive and electrically resistive body is thermally coupled with the AC plugs and the AC/DC converter circuit. In the AC/DC converter assembly of the present invention, thermal energy dissipated in the AC/DC converter circuit is thermally conducted to the AC plugs.

In accordance with the AC/DC converter assembly of the present invention, the heat conductive body should have at least a minimum thermal conductivity to allow adequate heat dissipation and a low electrical conductivity to prevent shorts. Further, if the conductive body is used in a structural capacity, or as electrical insulation between the primary and secondary portions of the conversion circuit, it is formed from a UL recognized electrical insulation material. In another aspect of the AC/DC converter assembly of the present invention, a UL recognized insulation material is formed around the thermally conductive and electrically resistive body for providing a structural enclosure for the AC/DC converter circuit.

Also in the present invention a device is provided for cooling one or more electronic circuits supplied by an external power source, where each of the circuits comprises a plurality of circuit elements and the elements further comprise heat producing and non-heat producing elements. The device according to the present invention comprises a thermally conductive mass in direct intimate contact with at least the heat producing elements of the circuits and with the power supply leads.

The present invention also discloses a system for cooling an electronic device, where the device comprises heat dissipating elements and is supplied by an external power source. According to the present invention, the device comprises means for conductively capturing heat produced by the heat dissipating elements of the device, and means for conducting the heat captured from the heat dissipating elements of the device into the external power source.

In a further aspect, the present invention describes a power conversion system. The power conversion system comprises a power supply, a power outlet for coupling an arbitrary device into a circuit containing the power supply, an electronic device with a power input, and, an adapter comprising at least one input and at least one output, the inputs comprising an input capable of coupling into the circuit containing the power supply, the outputs comprising an output compatible with the power input of the electronic device, the adapter further comprising heat dissipating elements and non-heat dissipating elements, wherein the heat dissipating elements are thermally coupled for conductive heat transfer to a heat conductive body, further wherein the heat conductive body is configured to be in direct thermal contact with the circuit containing the power supply.

Also, the present invention includes a method of manufacturing a power adaptor. The method of manufacturing includes the steps of providing a power conversion circuit, including a plurality of power supply leads, power conversion components, and power output leads, and of molding a heat conductive material around the power conversion components to form a plug structure and integrated strain relief structure.

DETAILED DESCRIPTION OF THE EMBODIMENTS

For illustration purposes only, and by way of example, the present invention is shown to be employed for an AC/DC converter. As will be seen below, the cooling system for the electronic device of the present invention can be easily employed in the fabrication of other electronic devices, such as, and without limitation, power amplifiers and computing devices. The invention will be described in detail below in the context of an application for an AC/DC converter; however, such disclosure is not intended to limit the scope of the present invention to such an application of the present invention.

Figure 1:
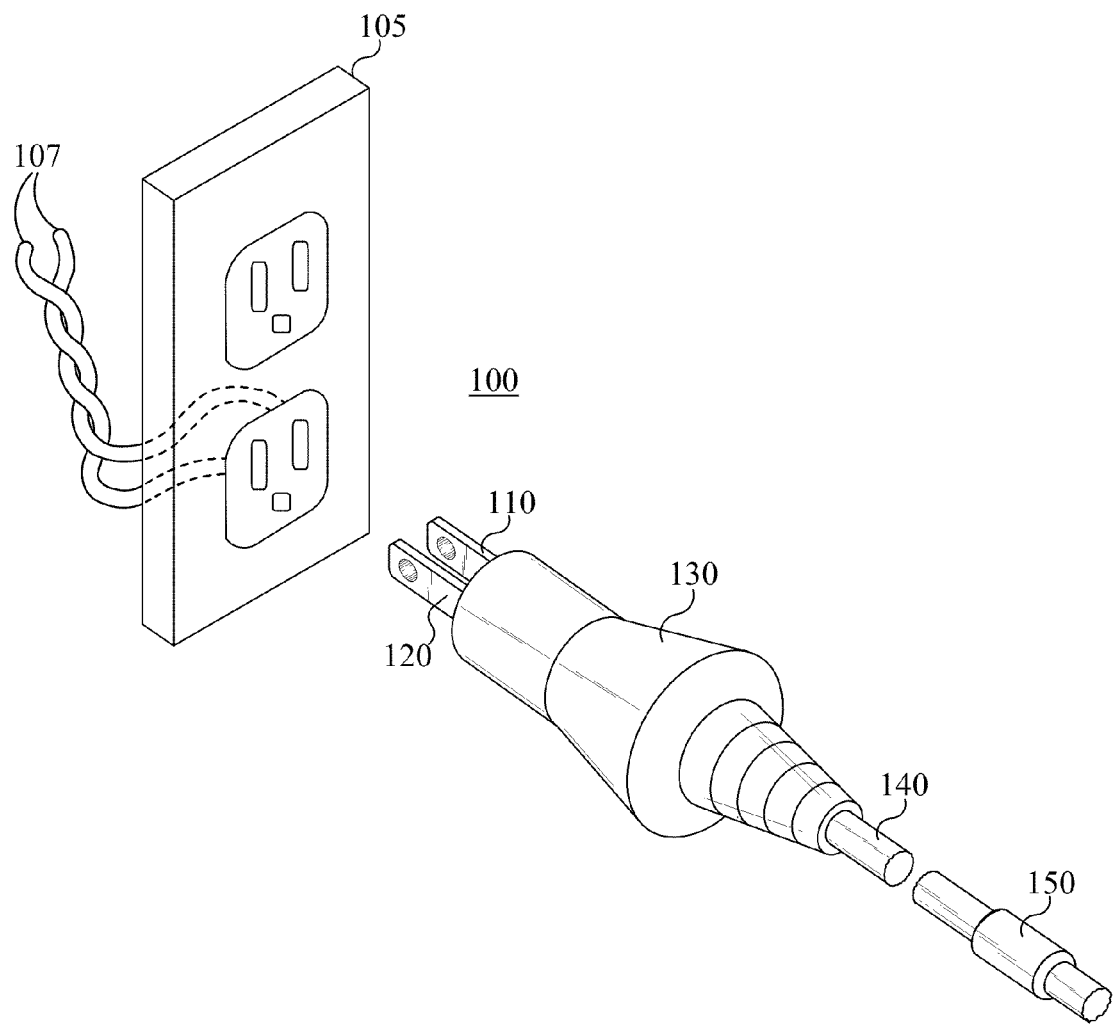
FIG. 1 is a perspective view of the device in an assembled state.

FIG. 1 shows a compact power conversion device 100 according to the present invention. The power conversion device 100 includes a substantially rigid body 130 from one end of which extend two power supply leads 110 and 120 that in create a standard male AC plug. The power supply leads 110 and 120 and can include apertures as shown or to be solid. The power supply leads 110 and 120 and can both be the same size as shown or have polarity such that one blade is wider. A third power supply lead can be used as a conventional ground terminal. From the opposite end of the substantially rigid body 130 extends a power cord 140 which terminates in a DC power coupling 150. As can be seen, the device bears a strong resemblance to a common AC power cord. The substantially rigid body 130 is shown with a particular industrial design. This industrial design is representative only and can be modified without departing from the invention. Also owing to the present invention, the device is substantially the same as a common AC power cord.

Figure 2:
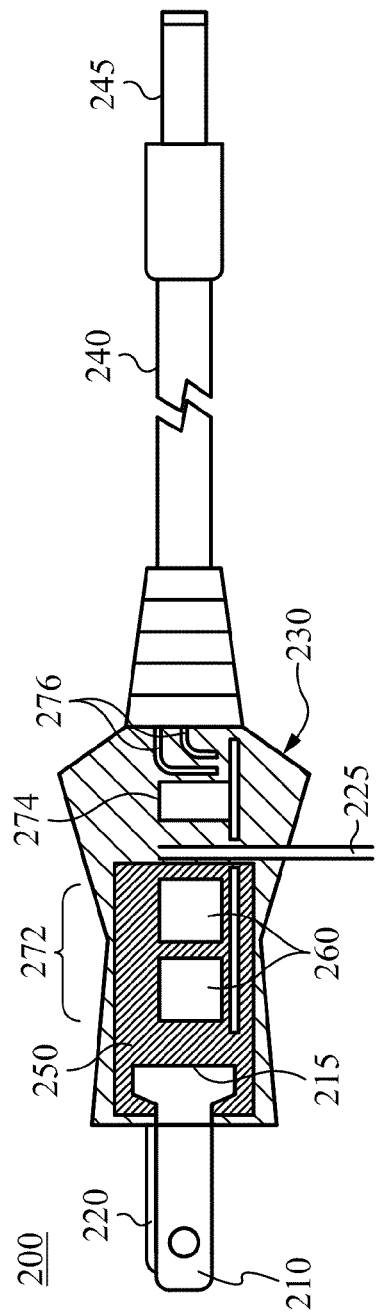
FIG. 2 is a partial cross sectional view of the preferred embodiment of the device wherein the device packaging is formed of multiple materials, at least one material being used in primarily structural way and at least one material being used primarily for heat transfer.

In FIG. 2, a partial cross sectional view of a power conversion device 200 is shown to include a substantially rigid body 230 from one end of which extend two power supply leads 210 and 220 that together form a standard male AC power plug. The device of FIG. 2 can but need not be the same as that shown in FIG. 1. From the opposite end of the substantially rigid body 230 extends a power cord 240 which terminates in a DC power coupling 245. The power cord 240 contains the power output leads 276 which are coupled with the power conversion circuit 270. The power conversion circuit 270 is shown schematically only with circuit elements represented by blocks; any conventional circuit could work using the present invention. The power conversion circuit 270 includes primary 272 and secondary 274 portions. Further, the body is seen to contain electrically and thermally conductive ends 215 of both power supply leads 210 and 220. Also illustrated is the gap 225 of at least 0.4 mm between the primary 272 and secondary 274 sides of the power conversion circuit 270. The gap 225 being filled with the material that the substantially rigid body 230 is comprised of, which is preferably a UL recognized electrical insulation material that provides the minimum required electrical insulation between the primary 272 and secondary 274 sides of the power conversion circuit 270. The power conversion circuit 270 is also shown to include heat generating components 260 within the primary portion 272. In the preferred embodiment, the structural body 230 is coupled to a heat conductive body 250 which is further thermally coupled for substantially efficient heat transfer to the heat generating components 260 and to the thermally conductive ends 215 of the power supply leads 210, 220 so that the heat generated in the heat generating components 260 is transferred into the power supply leads 210, 220 and from there to the power supply network (not shown) such as conventional power outlets and wall wiring. The thermal coupling is preferably accomplished by molding the heat conductive body 250 around the heat generating components 260 and the thermally conductive ends 215, but could be accomplished by any reasonable means. According to the present invention, the heat conductive body has at least a minimum thermal conductivity allow adequate heat dissipation and a low electrical conductivity to prevent shorts.

Figure 3:
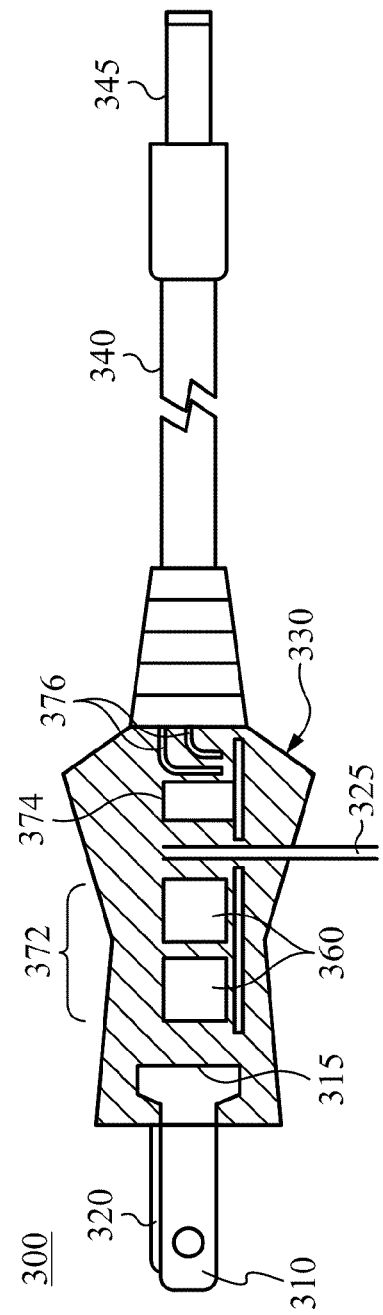
FIG. 3 is a partial cross sectional view of an alternate embodiment of the device wherein the device packaging is formed of thermally conductive material, used for both heat transfer and also structure.

In FIG. 3, a partial cross sectional view of a power conversion device 300 is shown to include a structural enclosure 330 from one end of which extend two power supply leads 310 and 320 that together form a standard male AC power plug. From the opposite end of the structural enclosure 330 extends a power cord 340 which terminates in a DC power coupling 345. The power cord 340 contains the power output leads 376 which are coupled with the power conversion circuit 370. The power conversion circuit 370 includes primary 372 and secondary 374 portions. Further, the body is seen to contain electrically and thermally conductive ends 315 of both power supply leads 310 and 320. Also illustrated is the gap 325 of at least 0.4 mm between the primary 372 and secondary 374 sides of the power conversion circuit 370. The gap 325 being filled with the material that the structural enclosure 330 is comprised of, which is preferably a UL recognized electrical insulation material that provides the minimum required electrical insulation between the primary 372 and secondary 374 sides of the power conversion circuit 370. The power conversion circuit 370 is also shown to include heat generating components 360 within the primary portion 372. In this embodiment, the structural body 330 is comprised of an electrically inert, thermally conductive material which is further thermally coupled for substantially efficient heat transfer to the heat generating components 360 and to the thermally conductive ends 315 of the power supply leads 310, 320 so that the heat generated in the heat generating components 360 is transferred into the power supply network (not shown) through the power supply leads 310, 320. The thermal coupling is preferably accomplished by molding the structural enclosure 330 around the heat generating components 360 and the thermally conductive ends 315, but could be accomplished by any reasonable means. According to the present invention, the structural enclosure 330 has a sufficient thermal conductivity to allow adequate heat dissipation and a low electrical conductivity to prevent shorts.

Also in accordance with the present invention, a method of cooling an electronic device supplied by an external power source is provided, which will now be discussed with reference to the above devices, and to FIGS. 2 and 3. The method of the present invention comprises thermally coupling for substantially efficient heat transfer at least a portion of an electronic device to a thermally conductive body, and thermally coupling for substantially efficient heat transfer at least a portion of each of a plurality of power supply leads to the thermally conductive body. Referring to FIG. 2, an electronic device 200 is constructed according to the method of the present invention. A portion of the electrical circuit 270 is thermally coupled to the thermally conductive body 270, which is also thermally coupled to the power supply leads 210, 220 for substantially efficient heat transfer. In the device 200, the structural integrity of the device package is maintained by the rigid shell body 230. Referring to FIG. 3, an electrical device 300 is constructed according to the method of the present invention. A portion of the electrical circuit 370 is thermally coupled to the thermally conductive body 330, which is also thermally coupled to the power supply leads 310, 320 for substantially efficient heat transfer. In the device 300, the thermally conductive body 330 also provides a structurally sound device package. In the method of the present invention, the structural materials are preferably comprised of a UL recognized insulation material. Also, in the method of the present invention the thermally conductive materials used to thermally couple the power supply leads to the electrical device have at least a minimum thermal conductivity to allow adequate heat dissipation and a low electrical conductivity to prevent shorts.

Because the device of the present invention comprises a solid mass of material molded around the circuit components of a power converter, a much more compact size is achieved than is present in prior art devices or possible with prior art designs. Though safety regulations dictate a 6.4 mm spacing through air between primary and secondary circuitry in a power converter, only 0.4 mm spacing is required through any homogeneous UL recognized electrical insulation material. In the preferred embodiment of the present invention, a UL recognized insulation material is used to provide the structure of the compact power conversion device. Though other materials are contemplated in the present invention, because of current regulations other contemplated materials that are non-UL recognized at the time of invention cannot be considered equivalent. Of course, any future materials meeting the approval of UL or some similar regulatory authority, would have to be considered equivalents.

The present invention has been described in terms of specific embodiments incorporating details to facilitate the understanding of the principles of construction and operation of the invention. As such, references, herein, to specific embodiments and details thereof are not intended to limit the scope of the claims appended hereto. It will be apparent to those skilled in the art that modifications can be made in the embodiment chosen for illustration without departing from the spirit and scope of the invention.

What is claimed is:

1. A compact power conversion device comprising:
    a) AC power supply leads comprising a prong end configured to plug into an AC wall socket coupled to an AC power supply network and a thermally conductive end;
    b) an AC to DC (AC/DC) power conversion circuit comprising a primary side having heat-generating components and a secondary side, the power conversion circuit configured to receive electric power from the AC power supply network via the AC power supply leads;
    c) a heat conductive body thermally coupled with the AC/DC power conversion circuit and thermally coupled to the thermally conductive end of the AC power supply leads, wherein the thermally conductive end is configured to conduct heat generated by the AC/DC power conversion circuit to the AC power supply leads, into the AC wall socket, and into the AC power supply network, and further wherein the heat conductive body is molded around substantially all of the heat-generating components of the primary side of the AC/DC power conversion circuit and is molded around at least a portion of the thermally conductive end forming a contact area wherein the contact area is configured for the heat to flow through the AC power supply leads, into the AC wall socket and into the AC power supply network, and wherein the heat conductive body comprises a material providing at least the minimum required electrical insulation between the AC power supply leads to prevent electrical shorting of the AC power supply leads; and
    d) a substantially rigid body encasing the heat conductive body and at least a portion of the secondary side of the AC/DC power conversion circuit wherein the prong end of the AC power supply leads protrude from the rigid body and wherein a thermal conductivity of the rigid body is configured such that the heat conductive body substantially efficiently transfers heat from AC/DC the power conversion circuit to the AC power supply leads, wherein the substantially rigid body limits thermal conductivity such that the rigid body external surface does not exceed 70° C. in temperature.

2. The compact power conversion device of claim 1, wherein the heat conductive body comprises a UL recognized insulation material.

3. The compact power conversion device of claim 1, wherein the substantially rigid body comprises a material that is different from the material comprising the heat conductive body.

4. The compact power conversion device of claim 1, wherein the heat conductive body is positioned between the AC power supply leads and the substantially rigid body.

5. The compact power conversion device of claim 1, wherein the heat conductive body is positioned between the AC/DC power conversion circuit and the substantially rigid body.

6. The compact power conversion device of claim 1, further comprising power output leads coupled with the AC/DC power conversion circuit.

7. The compact power conversion device of claim 1, further comprising the substantially rigid body coupled with the heat conductive body and with the AC/DC power conversion circuit to provide structural support.

8. The compact power conversion device of claim 1, wherein the heat conductive body forms also a structural enclosure for the AC/DC power conversion circuit and the thermally conductive end.

9. The compact power conversion device of claim 8, wherein the heat conductive body provides a structural element in an electrical housing.

10. The compact power conversion device power converter of claim 1, wherein the electrically inert, thermally conductive mass heat conductive body forms also a structural enclosure for the circuit and the AC power supply leads.

11. The compact power conversion device power converter of claim 1, wherein the electrically inert, thermally conductive mass heat conductive body is configured to provide structural support in an electrical housing.

12. The compact power conversion device of claim 1, wherein:
the AC power supply leads each extend out of the substantially rigid body all the way to the end of their prong end in a straight path, wherein the straight paths are parallel to one another; and
each AC power supply lead comprises a fixed position relative to the substantially rigid body.

13. A method of cooling an AC/DC electronic device comprising a primary side including heat-generating components and a secondary side, supplied by an external power source, the method comprising:
a) thermally coupling for substantially efficient heat transfer substantially all of the heat generating components of the AC/DC electronic device to a thermally conductive body;
b) thermally coupling at least a portion of each of a plurality of AC power supply leads and AC/DC electronic device to the thermally conductive body by molding the thermally conductive body around the at least a portion of the of each of a plurality of AC power supply leads and AC/DC electronic device with a material providing at least the minimum required electrical insulation between the AC power supply leads to prevent electrical shorting of the AC power supply leads; and
c) encasing the thermally conductive body and at least a portion of the secondary side of the AC/DC electronic device in a substantially rigid body wherein the AC power supply leads protrude from the body and wherein a thermal conductivity of the rigid body is configured so that there is a substantially efficient heat transfer through thermally conductive body to the AC power supply leads, wherein the substantially rigid body limits heat dissipation such that the surface temperature of the substantially rigid body does not exceed 70° C. in temperature.

14. The method of cooling the AC/DC electronic device of claim 13, wherein molding the thermally conductive body around the at least a portion of each of the plurality of AC power leads and AC/DC electronic device with a material comprises molding the thermally conductive body around at least a portion of each of the plurality of AC power leads and AC/DC electronic device with a UL recognized insulation material.

15. The method of cooling the AC/DC electronic device of claim 13, wherein encasing the thermally conductive body and the AC/DC electronic device in a substantially rigid body comprises encasing the thermally conductive body and the AC/DC electronic device in a material that is different from the material comprising the thermally conductive body.

16. The method of cooling the AC/DC electronic device of claim 13, wherein in encasing the AC/DC electronic device, at least a portion of each of the plurality of AC power supply leads, the thermally conductive body in any appropriate, rigid shell body, and the AC/DC electronic device is simultaneously embedded in the rigid shell body material and in the thermally conductive body.

17. The method of cooling the AC/DC electronic device of claim 13, wherein:
the AC power supply leads each extend out of the substantially rigid body in a straight path, wherein the straight paths are parallel to one another; and
each AC power supply lead comprises a fixed position relative to the substantially rigid body.

18. An AC/DC converter assembly comprising:
a) an AC/DC converter circuit having a primary portion and a secondary portion, the primary portion and the secondary portion having a space between them with a thickness, the primary portion having heat-generating components;
b) a plurality of AC plugs electrically coupled with the AC/DC converter circuit, wherein the AC plugs are configured to plug into an AC wall socket coupled to an AC power supply network;
c) a housing comprising a thermally conductive and electrically resistive body molded around substantially all of the heat-generating components of the primary portion of the AC/DC converter circuit and also around each of the plurality of AC plugs so that the thermally conductive and electrically resistive body is thermally coupled with the AC plugs and the AC/DC converter circuit, wherein the thermally conductive and electrically resistive body comprises a material providing at least the minimum required electrical insulation between the AC plugs to prevent electrical shorting of the AC plugs; and
d) a substantially rigid body encasing the housing and the at least a portion of the secondary side of the AC/DC converter circuit wherein the AC plugs protrude from the substantially rigid body and wherein a thermal conductivity of the substantially rigid body is configured to substantially efficiently conduct heat transfer from the AC/DC converter circuit through the housing to the AC plugs and on to the AC wall socket and to the AC power supply network, wherein the substantially rigid body limits heat dissipation such that the surface temperature of the substantially rigid body does not exceed 70° C. in temperature.

19. The AC/DC converter assembly of claim 18, wherein the thermally conductive and electrically resistive body comprises a UL recognized insulation material.

20. The AC/DC converter assembly of claim 18, wherein the substantially rigid body comprises a material different from the material comprising the thermally conductive and electrically resistive body.

21. The AC/DC converter assembly of claim 18, wherein the space between the primary portion and the secondary portion is filled by the substantially rigid body.

22. The AC/DC converter assembly of claim 18, wherein the thickness is less than 1 millimeter.

23. The AC/DC converter assembly of claim 18, wherein the housing is for providing a structural enclosure for the primary portion of the AC/DC converter circuit.

24. The AC/DC converter assembly of claim 18, wherein:
the AC plugs each extend out of the substantially rigid body in a straight path, wherein the straight paths are parallel to one another; and
each AC plug comprises a fixed position relative to the substantially rigid body.

25. The compact power conversion device of claim 1, wherein the primary side is separated from the secondary side by a gap of at least 0.4 mm.

26. The compact power conversion device of claim 25, wherein the substantially rigid body comprises the gap.

* * * * *

UNITED STATES PATENT AND TRADEMARK OFFICE
CERTIFICATE OF CORRECTION

PATENT NO. : 8,295,048 B2
APPLICATION NO. : 12/973774
DATED : October 23, 2012
INVENTOR(S) : Sharifipour et al.

It is certified that error appears in the above-identified patent and that said Letters Patent is hereby corrected as shown below:

In the Claims, in Claim 13, limitation b), please delete the extraneous "of" at column 9, line 24, so that the limitation b) correctly reads:

-- b) thermally coupling at least a portion of each of a plurality of AC power supply leads and AC/DC electronic device to the thermally conductive body by molding the thermally conductive body around the at least a portion of the each of a plurality of AC power supply leads and AC/DC electronic device with a material providing at least the minimum required electrical insulation between the AC power supply leads to prevent electrical shorting of the AC power supply leads; and --

In the Claims, in Claim 13, limitation c), please insert --the-- before "thermally" at column 9, line 36 so that limitation c) correctly reads:

-- encasing the thermally conductive body and at least a portion of the secondary side of the AC/DC electronic device in a substantially rigid body wherein the AC power supply leads protrude from the body and wherein a thermal conductivity of the rigid body is configured so that there is a substantially efficient heat transfer through the thermally conductive body to the AC power supply leads, wherein the substantially rigid body limits heat dissipation such that the surface temperature of the substantially rigid body does not exceed 70° C in temperature. --

Signed and Sealed this
Fourth Day of December, 2012

David J. Kappos
*Director of the United States Patent and Trademark Office*